United States Patent
Kim

(10) Patent No.: US 7,148,133 B1
(45) Date of Patent: Dec. 12, 2006

(54) METHOD OF MANUFACTURING FLASH MEMORY DEVICE

(75) Inventor: Choi Dong Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/489,231

(22) Filed: Jul. 19, 2006

(30) Foreign Application Priority Data

Nov. 23, 2005  (KR) .................... 10-2005-0112141

(51) Int. Cl.
  *H01L 21/8247* (2006.01)
(52) U.S. Cl. ................. 438/594; 438/264; 257/E21.179
(58) Field of Classification Search ........ 438/257–267, 438/593–594; 257/E21.179
See application file for complete search history.

(56) References Cited

U.S. PATENT DOCUMENTS 5,767,005 A * 6/1998 Doan et al. ................. 438/593

6,281,103 B1 * 8/2001 Doan ......................... 438/593

* cited by examiner

*Primary Examiner*—Richard A. Booth
(74) *Attorney, Agent, or Firm*—Marhall, Gerstein & Borun LLP

(57) ABSTRACT

A method of manufacturing a flash memory device, including the steps of laminating a tunnel oxide film and a first polysilicon layer on a region of a semiconductor substrate, and forming isolation films having a step with a first polysilicon layer between the tunnel oxide film and the first polysilicon layer; forming insulating film spacers on sidewalls of the isolation films and then depositing a second polysilicon layer on the entire structure; and, etching the second polysilicon layer with a slope using a mask, thus forming a floating gate, and then forming a conductive layer on the entire structure, wherein the second polysilicon layer is etched up to the tunnel oxide film. The insulating film spacers are formed on the sidewalls of the isolation films so that they serve as barriers when the floating gate is etched. The etch depth of the floating gate can be deeply formed, making it possible to reduce the inter-cell interference phenomenon.

4 Claims, 2 Drawing Sheets

METHOD OF MANUFACTURING FLASH MEMORY DEVICE

BACKGROUND

1. Field of the Invention

The invention relates generally to a method of manufacturing memory devices and, more particularly, to a method of manufacturing a flash memory device, wherein the interference phenomenon between adjacent floating gates can be minimized.

2. Discussion of Related Art

In the manufacturing methods for flash memory devices, the dimensions of spaces in which a unit active region and a unit field region will be formed have decreased in size as such devices have become more highly integrated. As a dielectric layer including a floating gate and a control gate are formed within a narrow active space, the interference phenomenon becomes more problematic since the inter-gate distance is narrowed.

FIGS. 1a and 1b are cross-sectional views illustrating a method of manufacturing a flash memory device to which self-aligned shallow trench isolation (STI) process is applied in the related art.

Referring to FIG. 1a, a tunnel oxide film 11, a first polysilicon layer 12, and a nitride film (not shown) are sequentially formed on a semiconductor substrate 10. The nitride film, the first polysilicon layer 12, the tunnel oxide film 11, and the semiconductor substrate 10 are sequentially etched using an etch process employing an isolation mask, thereby forming trenches.

An insulating film, such as a high density plasma (HDP) oxide film, is formed on the entire structure so that the trenches are buried. The insulating film is polished so that a top surface of the first polysilicon layer 12 is exposed. The nitride film is stripped to form isolation films 13 within the trenches.

A second polysilicon layer 14 is formed on the entire structure. The second polysilicon layer 14 is etched using a mask to form a floating gate including of the first polysilicon layer 12 and the second polysilicon layer 14. A dielectric layer 15 and a conductive layer 16 are sequentially formed on the entire structure and are then patterned using a mask, thereby forming control gates vertical to the isolation films 13.

As semiconductor devices become more highly integrated, however, the width D of the isolation film is reduced and the distance between adjacent first polysilicon layers is reduced accordingly. This generates the interference phenomenon by adjacent first polysilicon layers, which results in the interference phenomenon between the floating gates.

Furthermore, the threshold voltage (Vt) of the semiconductor substrate varies due to the interference phenomenon between the floating gates. This maximizes the interference phenomenon in the direction of the control gate, inevitably resulting in degraded device characteristics.

To solve the problems, if the top surface of the isolation film is etched in order to deepen the etch depth when the floating gate is etched as shown in FIG. 1b, an insulation depth D between the floating gates can be increased to improve the interference phenomenon between the floating gates.

If the etch depth is increased, however, the distance L between the active region and the control gate is narrowed. This results in variation in the cycling threshold voltage (Vt) upon cycling test.

SUMMARY OF THE INVENTION

In one embodiment, the invention provides a method of manufacturing a flash memory device, in which insulating film spacers are formed on sidewalls of isolation films so that they serve as barriers when a floating gate is etched, whereby the etch depth of the floating gate can become deep and the inter-cell interference phenomenon can be improved.

A method of manufacturing a flash memory device according to one embodiment of the invention includes the steps of laminating a tunnel oxide film and a first polysilicon layer on a region of a semiconductor substrate, and forming isolation films having a step with a first polysilicon layer between the tunnel oxide film and the first polysilicon layer; forming insulating film spacers on sidewalls of the isolation films and then depositing a second polysilicon layer on the entire structure; and, etching the second polysilicon layer with a slope using a mask, thus forming a floating gate, and then forming a conductive layer on the entire structure, wherein the second polysilicon layer is etched up to the tunnel oxide film.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will be described in detail in connection with certain exemplary embodiments with reference to the accompanying drawings.

FIGS. 2A to 2D are cross-sectional views illustrating a method of manufacturing a flash memory device according to an embodiment of the invention.

Figure 1A:
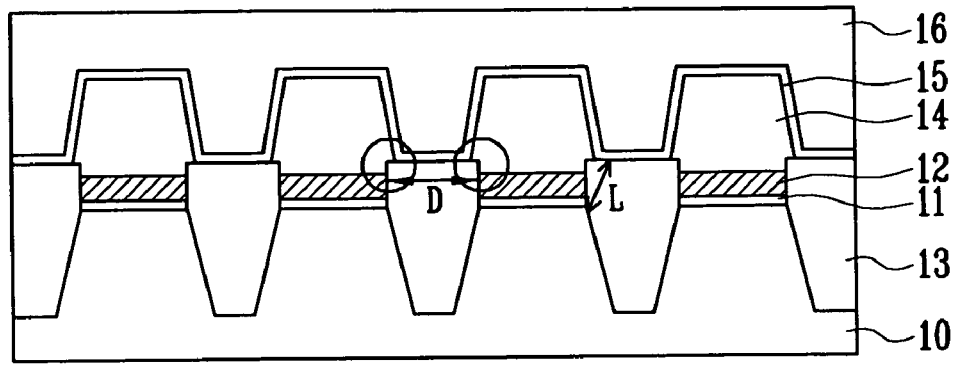
FIGS. 1a and 1b are cross-sectional views illustrating a method of manufacturing a flash memory device in the related art.
Figure 1B:
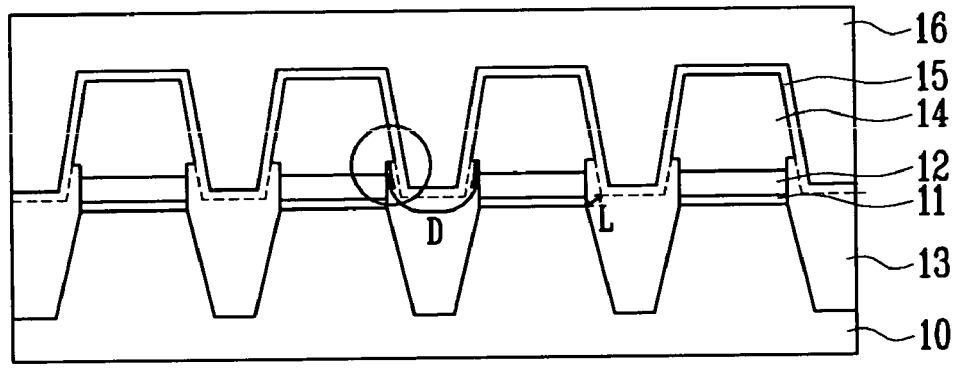
Figure 2A:
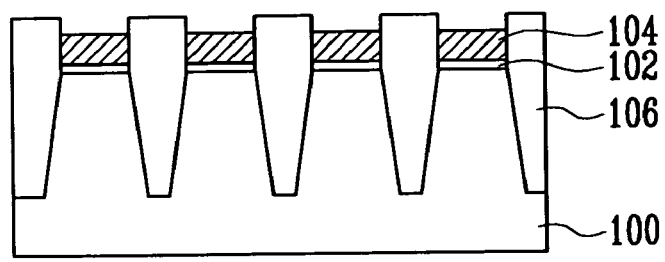
FIGS. 2A to 2D are cross-sectional views illustrating a method of manufacturing a flash memory device according to an embodiment of the invention.

Referring to FIG. 2A, a tunnel oxide film 102, a first polysilicon layer 104, and a nitride film (not shown) are sequentially formed on a semiconductor substrate 100. The nitride film, the first polysilicon layer 104, the tunnel oxide film 102, and the semiconductor substrate 100 are sequentially etched using an etch process employing an isolation mask, thereby forming trenches.

An insulating film, such as a HDP oxide film, for example, is formed on the entire structure so that the trenches are buried. The insulating film is polished such that a top surface of the first polysilicon layer 104 is exposed. The nitride film is stripped to form isolation films 106 within the trenches.

At this time, it is advantageous when the step (a) between the isolation films 106 and the first polysilicon layer 104 is great, preferably in the range of 100 Å to 2000 Å. Top edges of the isolation films 106 may be vertical or have a slope.

Figure 2B:
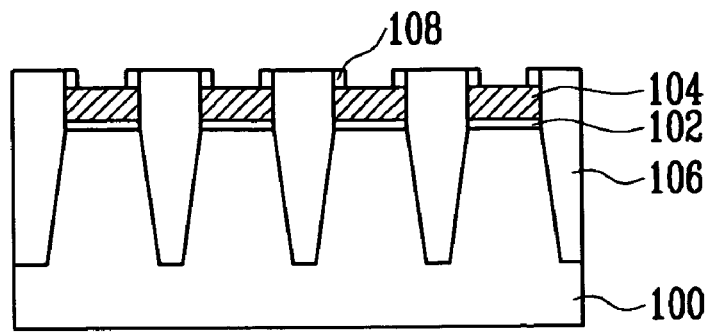

Referring to FIG. 2B, an insulating film is formed on the entire structure. The insulating film may be formed to a thickness of 50 Å to 500 Å using a nitride film, an oxide film or a SiON layer. The insulating film is blanket etched to form spacers 108 at the top edges of the isolation films 106.

Figure 2C:
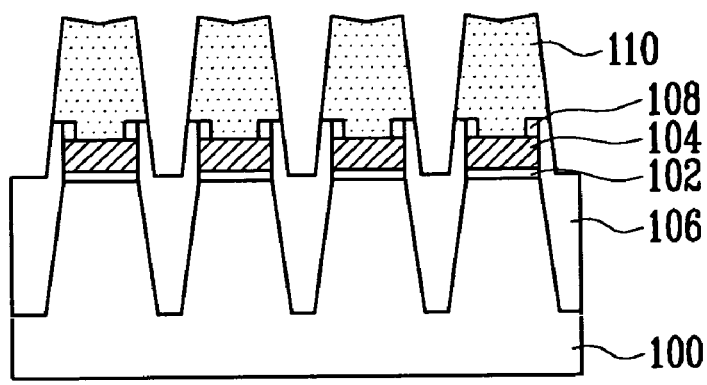

Referring to FIG. 2C, a second polysilicon layer 110 is formed on the entire structure. The second polysilicon layer 110 is etched with a slope using a mask, forming a floating gate including the first polysilicon layer 104 and the second polysilicon layer 110. The second polysilicon layer 110 is etched up to the tunnel oxide film 102 so that it has a deep etch depth, forming a step thereby reducing the inter-cell interference phenomenon. The greater the size of the step between the isolation films 106 and the first polysilicon layer 104, the greater the effectiveness in reducing inter-cell interference.

Though misalignment occurs when the second polysilicon layer 110 is etched, the distance between the active region and a control gate to be formed in a subsequent process can be kept intact by the spacers 108 serving as barriers.

Before the second polysilicon layer 110 is etched, plasma atmosphere is prepared. The plasma atmosphere preferably includes introducing HBr gas and applying a top power of 240 W to 260 W for two seconds to four seconds with a pressure being set to 5 mT to 15 mT and a temperature being set to 5° C. to 15° C. To constantly maintain the temperature of the wafer stage region, the He pressure may be kept to 3 T to 13 T.

The etch process of the second polysilicon layer 110 preferably includes introducing a mixed gas of $Cl_2$ and HBr in the ratio of 4:6 and applying the top power of 290 W to 310 W and the bottom power of 55 W to 75 W for 25 seconds to 45 seconds with a pressure being set to 2.5 mT to 7.5 mT and a temperature being set to 5° C. to 15° C. To constantly maintain the temperature of the wafer stage region, the He pressure may preferably be maintained to 3 T to 13 T.

Figure 2D:
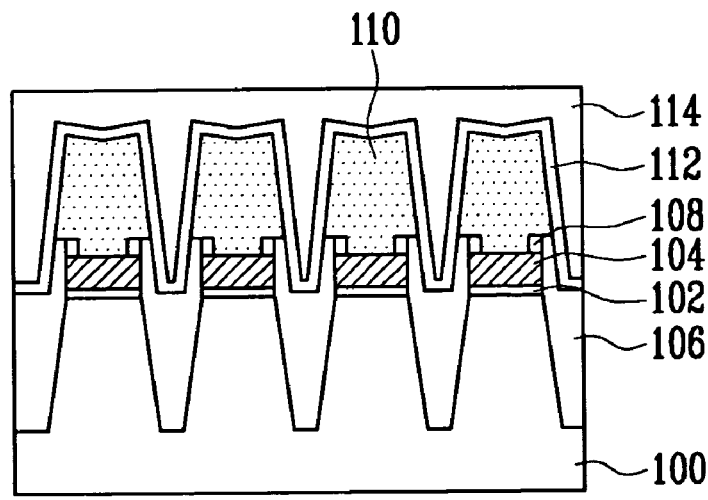

Referring to FIG. 2D, a dielectric layer 112 and a conductive layer 114 are sequentially formed on the entire structure and are then patterned using a mask, thereby forming control gates vertical to the isolation films 106.

As described above, according to the invention, the insulating film spacers are formed on the sidewalls of the isolation films so that they serve as barriers when the floating gate is etched. The etch depth of the floating gate can be deeply formed. It is therefore possible to improve the inter-cell interference phenomenon.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A method of manufacturing a flash memory device, the method comprising the steps of:
   laminating a tunnel oxide film and a first polysilicon layer on a region of a semiconductor substrate, and forming isolation films having a step with a first polysilicon layer between the tunnel oxide film and the first polysilicon layer;
   forming insulating film spacers on sidewalls of the isolation films and then depositing a second polysilicon layer on the entire structure; and
   etching the second polysilicon layer with a slope using a mask, thus forming a floating gate, and then forming a conductive layer on the entire structure, wherein the second polysilicon layer is etched up to the tunnel oxide film.

2. The method of claim 1, wherein the step between the isolation films and the first polysilicon layer is in the range of 100 Å to 2000 Å in depth.

3. The method of claim 1, comprising forming the spacers of a nitride film, an oxide film, or a SiON layer.

4. The method of claim 1, comprising preparing a plasma atmosphere before the etch process of the second polysilicon layer.

* * * * *